(12) United States Patent
Kim et al.

(10) Patent No.: US 8,637,990 B2
(45) Date of Patent: Jan. 28, 2014

(54) SEMICONDUCTOR DEVICE AND METHOD FOR FABRICATING THE SAME

(75) Inventors: Doo-Kang Kim, Gyeonggi-do (KR); Dae-Young Seo, Gyeonggi-do (KR)

(73) Assignee: Hynix Semiconductor Inc., Gyeonggi-do (KR)

(*) Notice: Subject to any disclaimer, the term of this patent is extended or adjusted under 35 U.S.C. 154(b) by 91 days.

(21) Appl. No.: 13/176,170

(22) Filed: Jul. 5, 2011

(65) Prior Publication Data
US 2012/0001346 A1 Jan. 5, 2012

(30) Foreign Application Priority Data
Jul. 5, 2010 (KR) .................. 10-2010-0064461

(51) Int. Cl.
*H01L 23/48* (2006.01)
(52) U.S. Cl.
USPC ............ 257/774; 257/E23.011; 257/E21.575; 438/612

(58) Field of Classification Search
USPC .............. 257/68, 71, 296, 300, 307, 905, 908
See application file for complete search history.

(56) References Cited

U.S. PATENT DOCUMENTS

| 2002/0135007 A1* | 9/2002 | Koike et al. ................... 257/301 |
| 2007/0155077 A1* | 7/2007 | Schloesser .................... 438/197 |
| 2008/0197392 A1* | 8/2008 | Sakoh et al. ................... 257/296 |
| 2008/0283957 A1* | 11/2008 | Kang et al. .................... 257/499 |

FOREIGN PATENT DOCUMENTS

JP    10084091 A   * 3/1998

* cited by examiner

*Primary Examiner* — David Vu
*Assistant Examiner* — Jonathan Han
(74) *Attorney, Agent, or Firm* — IP & T Group LLP

(57) ABSTRACT

A semiconductor device includes a word line, a bit line crossing the word line, an active region arranged in an oblique direction at the word line and the bit line, and a contact pad contacting the active region, where the contact pad extends in the oblique direction.

7 Claims, 20 Drawing Sheets (PRIOR ART)

(FIRST EMBODIMENT)

(PRIOR ART)

(SECOND EMBODIMENT)

SEMICONDUCTOR DEVICE AND METHOD FOR FABRICATING THE SAME

CROSS-REFERENCE TO RELATED APPLICATIONS

The present application claims priority of Korean Patent Application No. 10-2010-0064461, filed on Jul. 5, 2010, which is incorporated herein by reference in its entirety.

BACKGROUND

1. Field

Exemplary embodiments of the present invention relate to a technology for fabricating a semiconductor device, and more particularly, to a semiconductor device having a $6F^2$ cell architecture and a method for fabricating the same.

2. Description of the Related Art

With the development of the fabrication technology of semiconductor devices, the size of the semiconductor devices has been reduced, and the integration degree thereof has been rapidly increased. A cell architecture of a memory device, such as DRAM (Dynamic Random Access Memory), changes from $8F^2$ architecture to $6F^2$ architecture, for higher integration. Here, F means a minimum critical dimension (CD) applied to the design rule of the memory device.

FIG. 1 is a plan view of a conventional semiconductor device having a $6F^2$ cell architecture. FIG. 2 is a cross-sectional view taken along a line A-A' of FIG. 1.

Referring to FIGS. 1 and 2, the conventional semiconductor device having a $6F^2$ cell architecture includes a plurality of active regions 13 defined by an isolation layer 12 formed in a substrate 11 (e.g., the regions arranged in an oblique direction in FIG. 1), a plurality of buried gates 100 crossing both of the active regions 13 and the isolation layer 12, and a plurality of bit lines 20 extended in a direction perpendicular to the buried gates 100. Each of the buried gates 100 includes a trench 14 formed in the substrate 11, a gate dielectric layer 15 formed on the trench 14, a gate electrode 16 formed on the gate dielectric layer 15 to partially fill the trench 14, and a sealing layer 17 filling the rest of the trench 14. The bit line 20 is coupled to the center portion of the active region 13 by a bit line contact plug 19 passing through an interlayer dielectric layer 18. Although not illustrated in the drawings, storage node contact plugs are coupled to both edges (refer to symbol 'A') of the active region 13 which are not covered by the bit line 12.

The conventional semiconductor device has such a structure that the active regions 13 are arranged in an oblique direction at the buried gate 100 and the bit line 20, in order to implement a $6F^2$ cell architecture. Therefore, there is a limit in securing an exposed area of both edges (refer to symbol 'A') of an active region which are to be coupled to storage node contact plugs. Accordingly, it is difficult to secure a sufficient process margin in forming the storage node contact plugs.

Therefore, a method of increasing the CD of the active region 13 in its longitudinal direction, that is, the oblique direction, has been proposed. However, when the longitudinal length of the active region 13 is increased, a bridge may be formed between the active regions 13 positioned on the same oblique line. Furthermore, as the design of the active region 13 is changed, the design of all the components such as the buried gate 100, the bit line contact plug 19, and the bit line 20 which are to be formed by subsequent processes is to be changed. Accordingly, production cost may increase.

SUMMARY

An embodiment of the present invention is directed to a semiconductor device having a $6F^2$ cell architecture and capable of substantially preventing a bridge between active regions and simultaneously securing a contact margin of a storage node contact plug.

In accordance with an embodiment of the present invention, a semiconductor device includes: a word line; a bit line crossing the word line; an active region arranged in an oblique direction at the word line and the bit line; and a contact pad contacting the active region, wherein the contact pad extends in the oblique direction. In accordance with another embodiment of the present invention, a method for fabricating a semiconductor device includes: forming an isolation layer in a substrate to define an active region arranged in a first direction; forming a word line in the substrate to cross the active region in an oblique direction; forming an interlayer dielectric layer over the entire surface of the substrate; forming a contact pad passing through the interlayer dielectric layer and contacting the active region, wherein the contact pad extends in the first direction; and forming a bit line crossing the word line.

DETAILED DESCRIPTION

Figure 1:
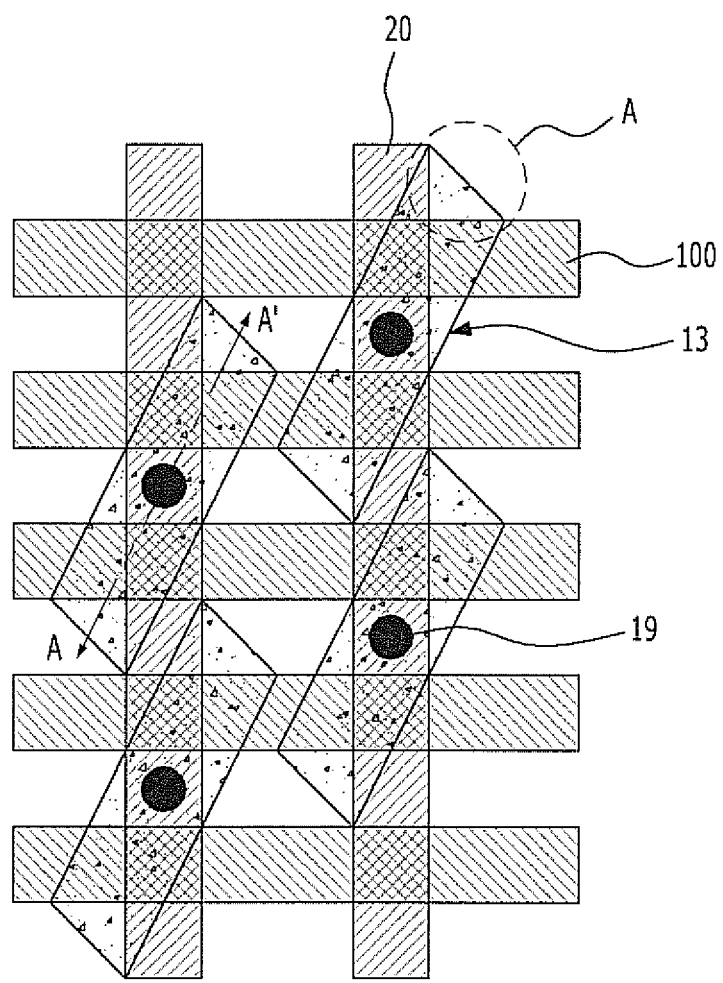
FIG. 1 is a plan view of a conventional semiconductor device having a $6F^2$ cell architecture.
Figure 2:
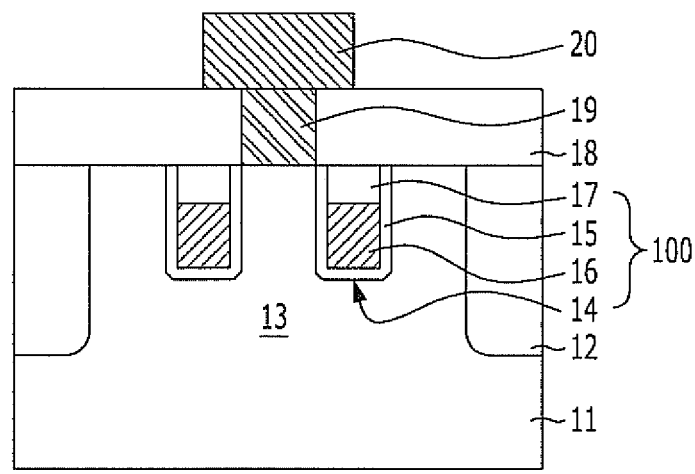
FIG. 2 is a cross-sectional view taken along a line A-A of FIG. 1.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

The embodiments of the present invention provide a semiconductor device capable of substantially preventing a bridge between active regions in a 6F² cell architecture and simultaneously securing a contact margin of a storage node contact plug, and a method for fabricating the same. The semiconductor device is characterized in that it includes a contact pad which is formed over a substrate and on both ends of an active region as an extended area of the active region and simultaneously provide a storage node contact margin.

FIGS. 3A to 3E are plan views illustrating a method for fabricating a semiconductor device in accordance with a first embodiment of the present invention. FIGS. 4A to 4E are cross-sectional views taken along lines A-A' of FIGS. 3A to 3E, respectively.

Referring to 3A and 4A, an isolation layer 32 is formed in a substrate 31 to define a plurality of active regions 33. At this time, the active regions 33 may have such a structure that the major axis thereof is extended in an oblique direction at a buried gate and a bit line formed subsequently.

A plurality of buried gates 200 are formed in the substrate 31 so as to cross both of the isolation layer 32 and the active regions 33. The buried gates 200 serve as word lines. A method for forming the buried gates 200 is described in detail as follows.

First, a plurality of trenches 34 are formed in the substrate 31 so as to cross both of the isolation layer 32 and the active regions 33. A gate dielectric layer 35 is formed on the surface of each of the trenches 34. The gate dielectric layer 35 may be formed of oxide, for example, silicon oxide ($SiO_2$) by using thermal oxidation. Deposition and etch-back processes are sequentially performed on the gate dielectric layer 35 to form a gate electrode 36 which partially fills the trench 34. A sealing layer 37 is formed on the gate electrode 36 so as to fill the rest of the trench 34. The sealing layer 37 serves to protect the gate electrode 36 during a subsequent process. The sealing layer 37 may include a single layer formed of oxide or nitride or a stacked layer of oxide and nitride.

Figure 3A:
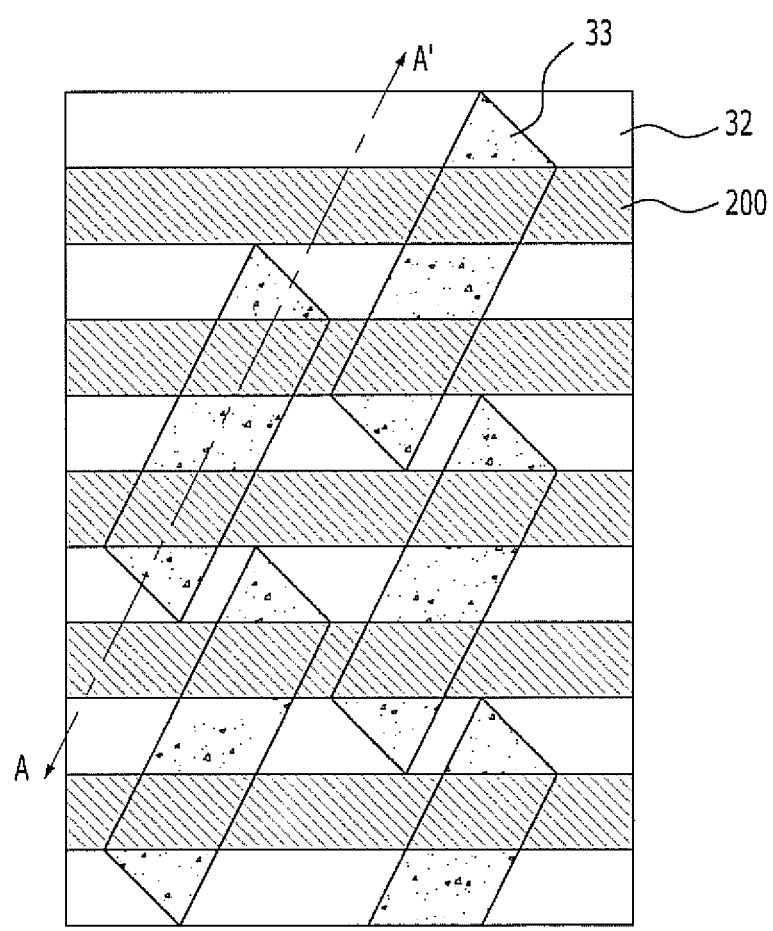
FIGS. 3A to 3E are plan views illustrating a method for fabricating a semiconductor device in accordance with a first embodiment of the present invention.
Figure 3B:
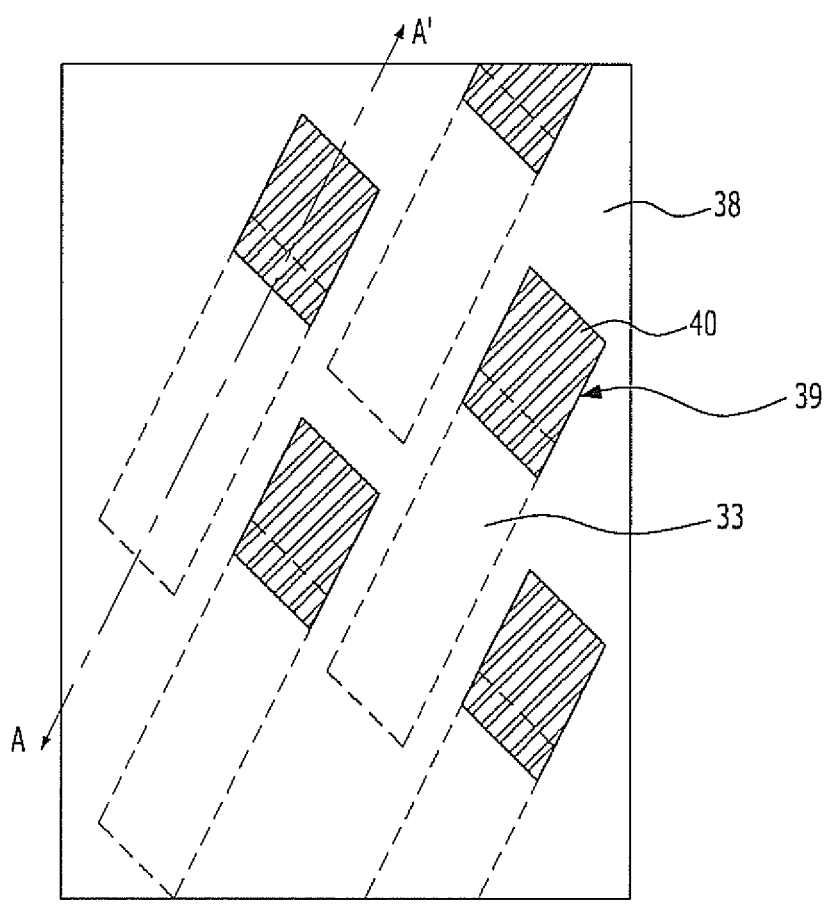
Figure 4A:
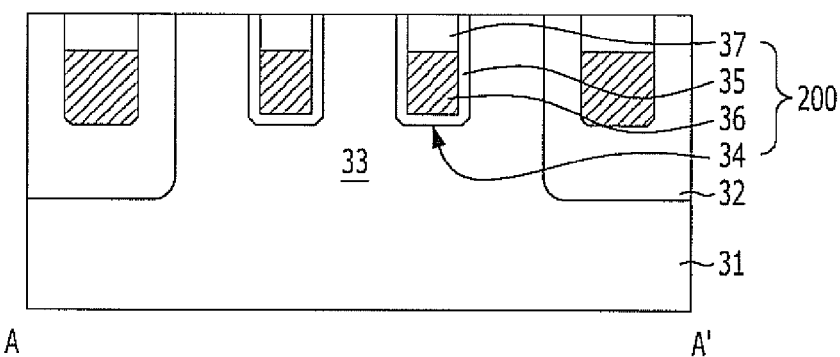
FIGS. 4A to 4E are cross-sectional views taken along lines A-A' of FIGS. 3A to 3E.
Figure 4B:
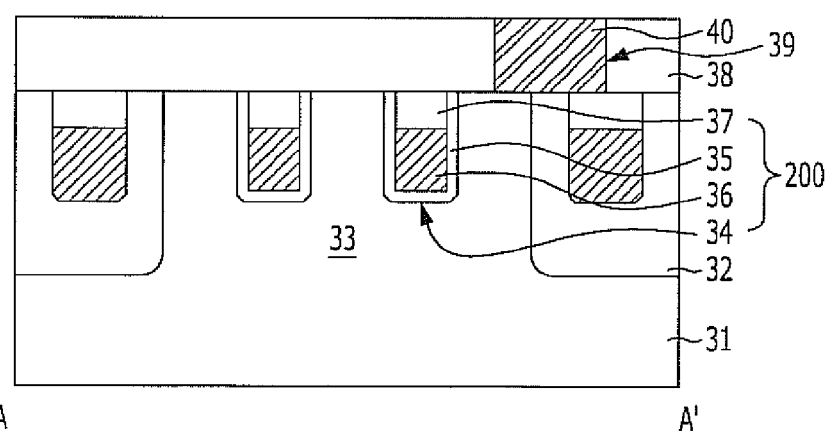

Referring to FIGS. 3B and 4B, a first interlayer dielectric layer 38 is formed on the entire surface of the substrate 31.

The first interlayer dielectric layer 38 is selectively etched to form an open region 39 which exposes one end of the active region 33 and the isolation layer 32. The open region 39 may be formed in a line type pattern extended in the oblique direction or the longitudinal direction of the active region 33. At this time, the open region 39 is formed in such a manner as not to expose the end of another active region 33 adjacent to the active region 33 of the exposed one end in the oblique direction. Furthermore, the CD of the open region 39 may be set to be equal to or larger than that of the active region 33 in their widths.

The open region 39 is filled with a conductive material to form a contact pad 40. At this time, the contact pad 40 may have an effect equivalent to the extension of the active region 33 in the oblique direction and serve as a part of a storage node contact plug through a subsequent process.

As the contact pad 40 is formed on the substrate 31 and realizes such the effect as to expand the active region in the oblique direction, the CD of the active region 33 may be adequately expanded/enlarged without changing the design of components such as the active region 33 and the buried gate 200.

Figure 3C:
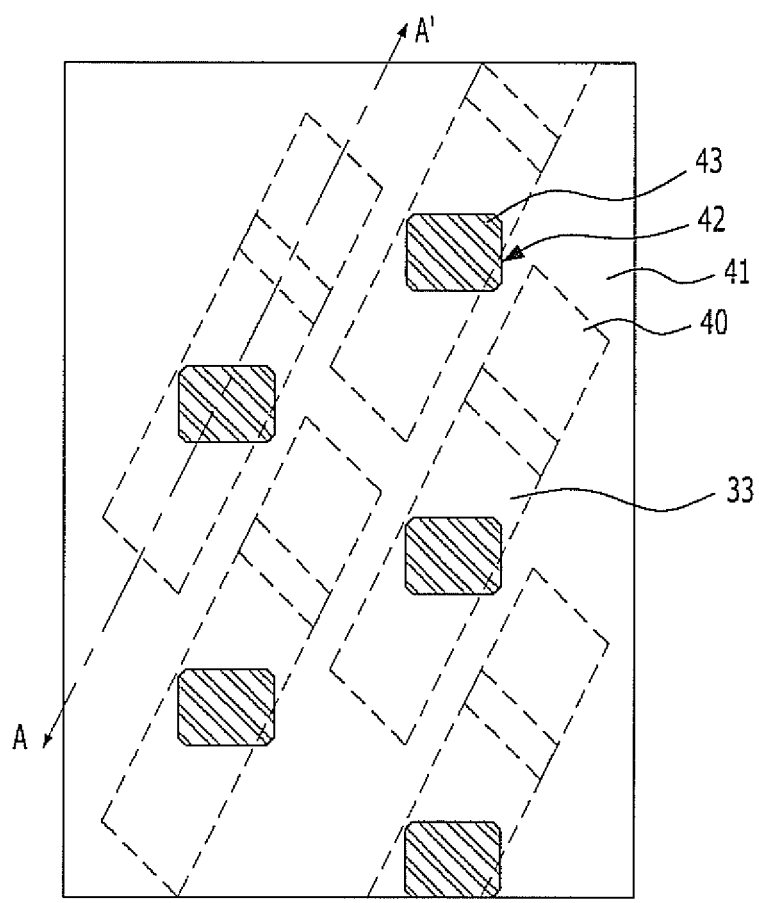
Figure 4C:
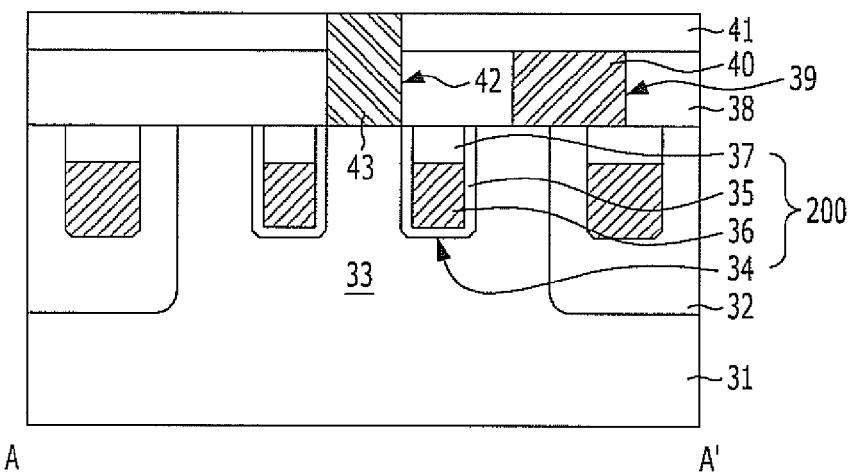

Referring to FIGS. 3C and 4C, a second interlayer dielectric layer 41 is formed over the entire surface of the substrate 31 having the contact pad 40 formed thereon. The second interlayer dielectric layer 41 serves to electrically isolate a bit line from the contact pad 40. The second interlayer dielectric layer 41 may be formed of the same material as the first interlayer dielectric layer 38, for convenience of subsequent processes.

The first and second interlayer dielectric layers 38 and 41 are selectively etched to form a bit line contact hole 42 which exposes the center portion of the active region 33 between the buried gates 200. At this time, the bit line contact hole 42 may expose the adjacent isolation layer 32 as well as the center portion of the active region 33.

The bit line contact hole 42 is filled with a conductive material to form a bit line contact plug 43.

Figure 3D:
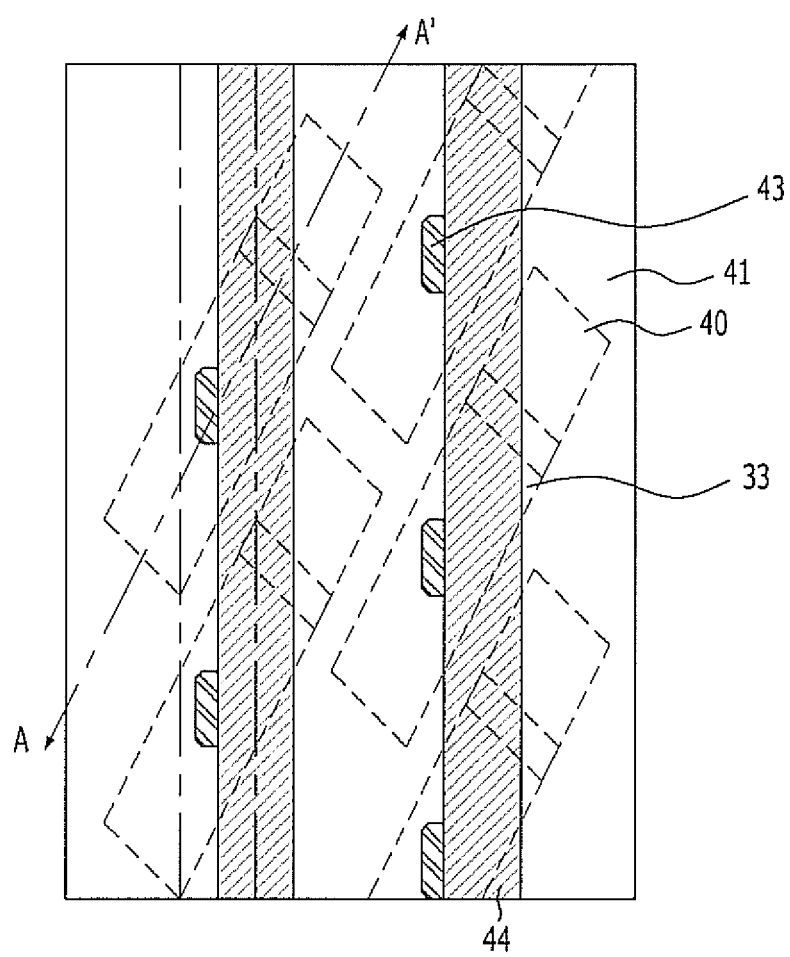
Figure 4D:
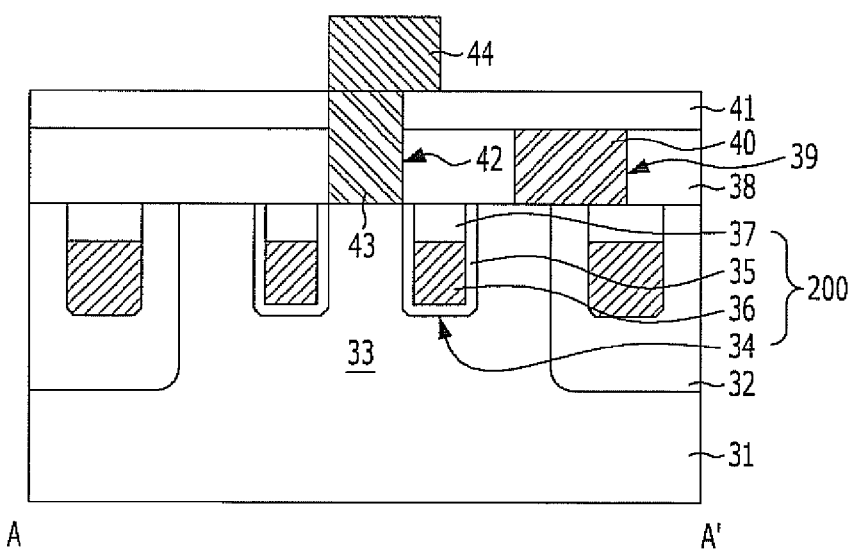

Referring to FIGS. 3D and 4D, a bit line 44 is formed on the second interlayer dielectric layer 41 so as to contact the bit line contact plug 43. At this time, the bit line 44 is formed to cross the buried gate 200.

Since the semiconductor device in accordance with the first embodiment of the present invention has such a structure that the contact pad 40 serves as the extended area of the active region 33, the bit line 44 may be formed to shift/lean from the center line of the active region 33 toward the contact pad 40 by a certain distance, compared with the conventional bit line. Such a structure may also increase a contact margin of a storage node contact plug which is to be coupled to the other end of the active region 33 where the contact pad 40 is not formed.

Figure 3E:
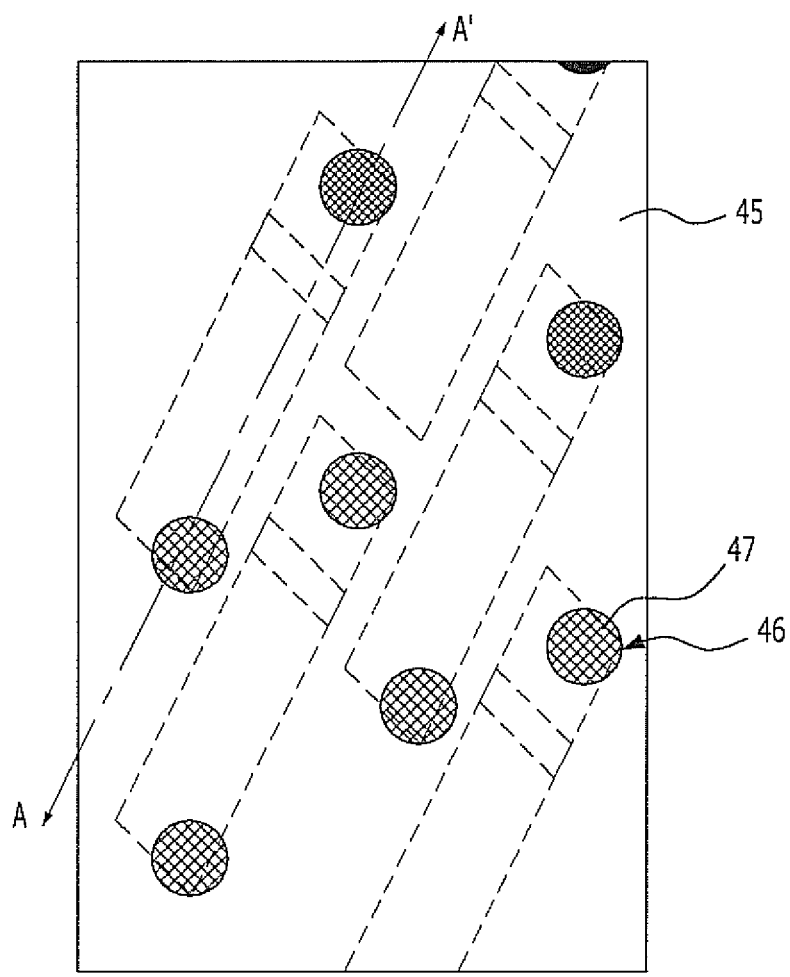
Figure 4E:
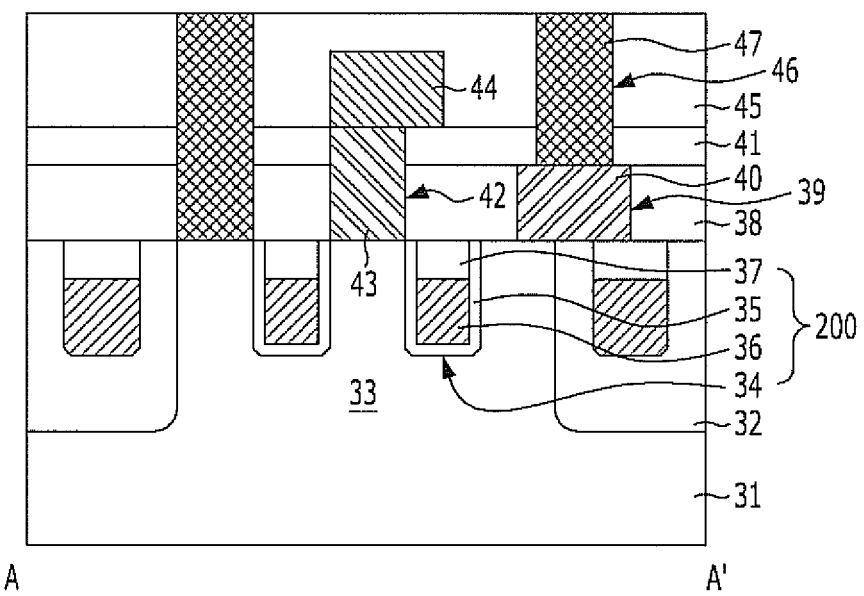

Referring to FIGS. 3E and 4E, a third interlayer dielectric layer 45 is formed on the second interlayer dielectric layer 41 so as to cover the bit line layer 41. For convenience of a subsequent process, the third interlayer dielectric layer 45 may be formed of the same material as the first and second interlayer dielectric layers 38 and 41.

The first to third interlayer dielectric layers 38, 41, and 45 are selectively etched to form storage node contact holes 46. At this time, a storage node contact hole 46 formed at one edge of the active region 33 exposes the contact pad 40, and a storage node contact hole 46 formed at the other edge of the active region 33 exposes the active region 33.

The storage node contact hole 46 is filled with a conductive material to form a storage node contact plug 47. At this time, the storage node contact plug 47 may be formed of the same material as the contact pad 40.

In accordance with the first embodiment of the present invention, the contact pad 40 is formed on the substrate 31 so as to contact one end of the active region 33, thereby preventing a bridge between adjacent active regions 33 and simultaneously securing a contact margin of the storage node contact plug 47. This will be described in detail with reference to FIG. 5.

Figure 5:
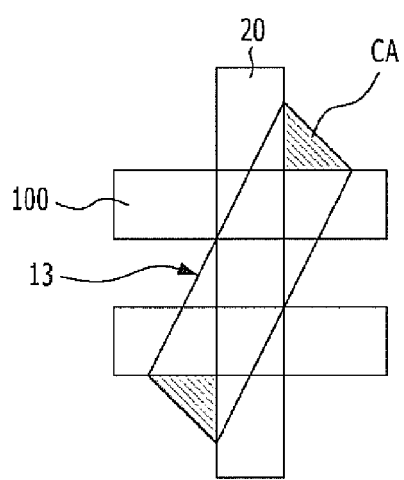
FIG. 5 is a plan view comparatively illustrating the conventional semiconductor device and the semiconductor device in accordance with the first embodiment of the present invention.
Figure 5:
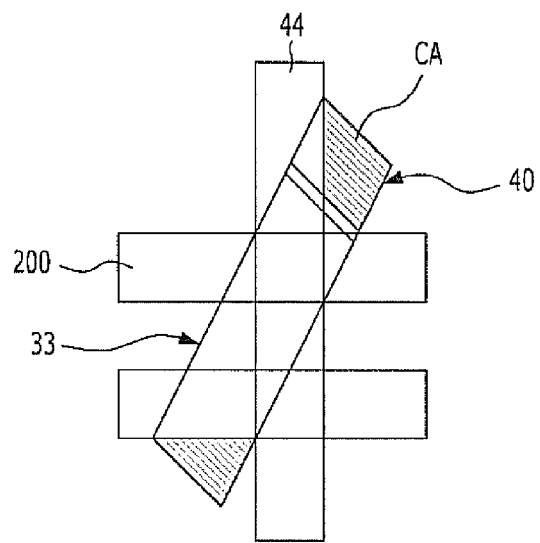

FIG. 5 is a plan view comparatively illustrating the conventional semiconductor device and the semiconductor device in accordance with the first embodiment of the present invention.

Referring to FIG. 5, the conventional semiconductor device has such a structure that the contact area CA of both edges of the active region 13 where a storage node contact plug is to be formed is significantly reduced by the buried gate 100 and the bit line 20.

The semiconductor device in accordance with the first embodiment of the present invention may increase the contact areas CA of both edges of the active region 33 where a storage node contact plug is to be formed by the contact pad 40 coupled to one end of the active region 33, even if the active region 33 and the buried gate 200 have the same structure as the conventional semiconductor device. At this time, the contact area CA of one edge of the active region 33 is increased by the contact pad 40, and the contact area CA of the other edge of the active region 33 is increased by shifting the bit line 44 toward the one edge coupled to the contact pad 40, compared with the conventional semiconductor device.

FIGS. 6A to 6E are plan views illustrating a method for fabricating a semiconductor device in accordance with a second embodiment of the present invention. FIGS. 7A to 7E are cross-sectional views taken lines A-A' of FIGS. 6A to 6E, respectively.

Figure 6A:
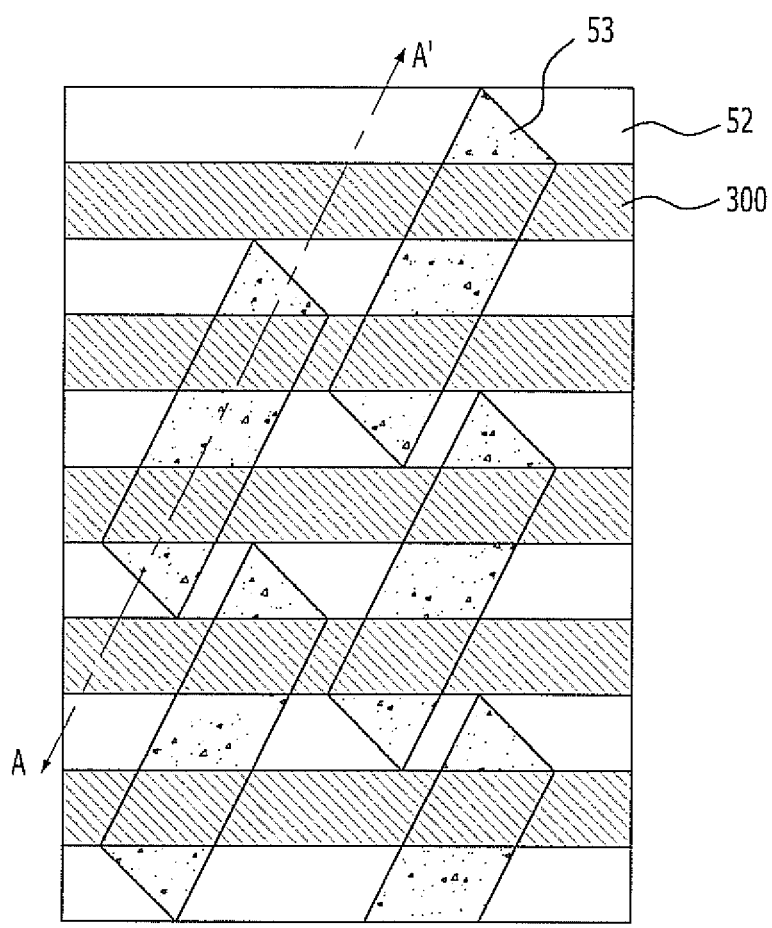
FIGS. 6A to 6E are plan views illustrating a method for fabricating a semiconductor device in accordance with a second embodiment of the present invention.
Figure 7A:
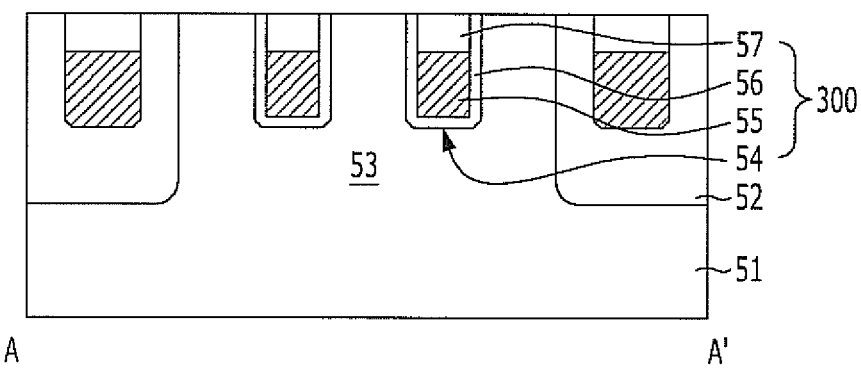
FIGS. 7A to 7E are cross-sectional views taken lines A-A' of FIGS. 6A to 6E.

Referring to FIGS. 6A and 7A, an isolation layer 52 is formed in a substrate 51 to define a plurality of active regions 53. At this time, the active regions 53 may have such a structure that the major axis thereof is extended in an oblique direction at a buried gate and a bit line formed subsequently.

A plurality of buried gates 300 are formed in the substrate 51 so as to cross both of the isolation layer 52 and the active regions 53. The formation process of the buried gates 300 may be the same as the formation process of the buried gates 200 in accordance with the first embodiment of the present invention. Therefore, the detailed descriptions thereof are omitted here.

Figure 6B:
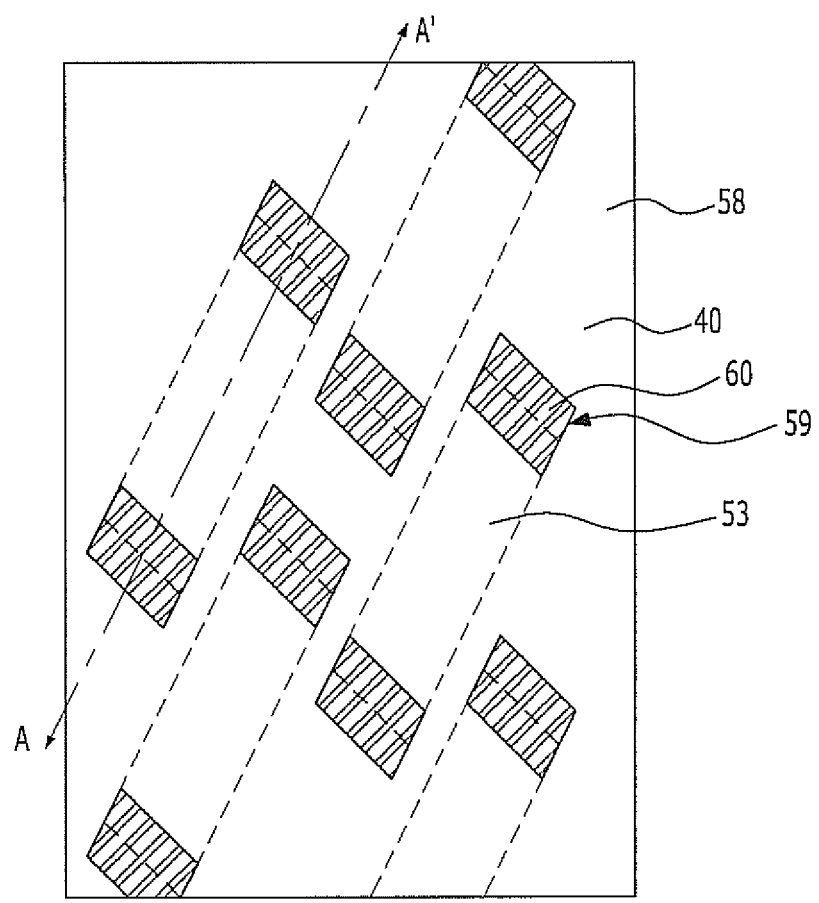
Figure 7B:
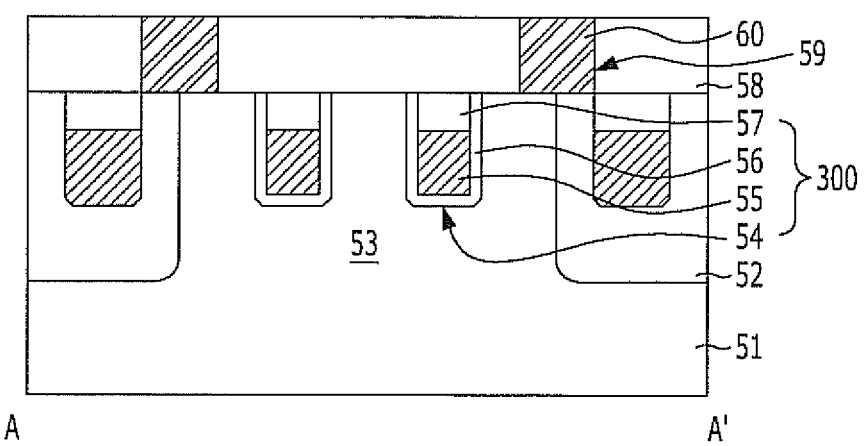

Referring to FIGS. 6B and 7B, a first interlayer dielectric layer 58 is formed on the entire surface of the substrate 51.

The first interlayer dielectric layer 58 is selectively etched to form open regions 59 which expose both ends of the active region 53 and the isolation layer 52. The open regions 59 may be formed in a line type pattern extended in the oblique direction or the longitudinal direction of the active region 53. Furthermore, the CD of the open region 59 may be set to be equal to or larger than that of the active region 53 in their widths.

The open region 59 is filled with a conductive material to form a contact pad 60. At this time, the contact pad 60 may have an effect equivalent to the extension of the active region 53 in the oblique direction and serve a part of a storage node contact plug through a subsequent process.

The contact pad 60 is formed on the substrate 51 to realize such the effect as to expand the active region 53 in the oblique direction. Therefore, the CD of the active region 53 may be adequately enlarged without changing the design of the components such as the active region 53 and the buried gate 300.

Figure 6C:
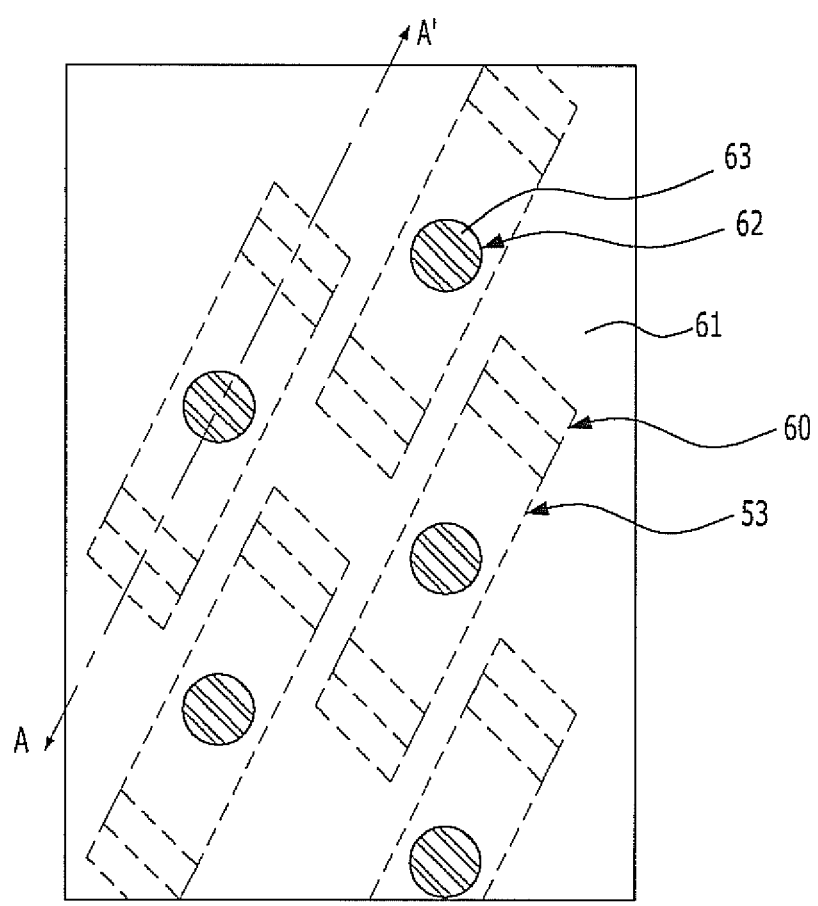
Figure 7C:
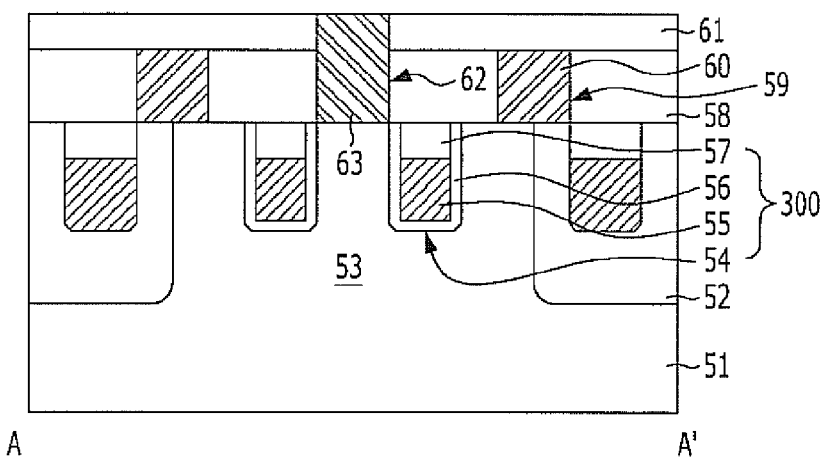

Referring to FIGS. 6C and 7C, a second interlayer dielectric layer 61 is formed over the entire surface of the substrate 51 having the contact pad 60 formed thereon. The second interlayer dielectric layer 61 serves to electrically isolate a bit line from the contact pad 60. The second interlayer dielectric layer 61 may be formed of the same material as the first interlayer dielectric layer 58, for convenience of a subsequent process.

The first and second interlayer dielectric layers 58 and 61 are selectively etched to form a bit line contact hole 62 which exposes the center portion of the active region 53 between the buried gates 300. At this time, the bit line contact hole 62 may expose the adjacent isolation layer 52 as well as the center portion of the active region 53.

The bit line contact hole 62 is filled with a conductive material to form a bit line contact plug 63.

Figure 6D:
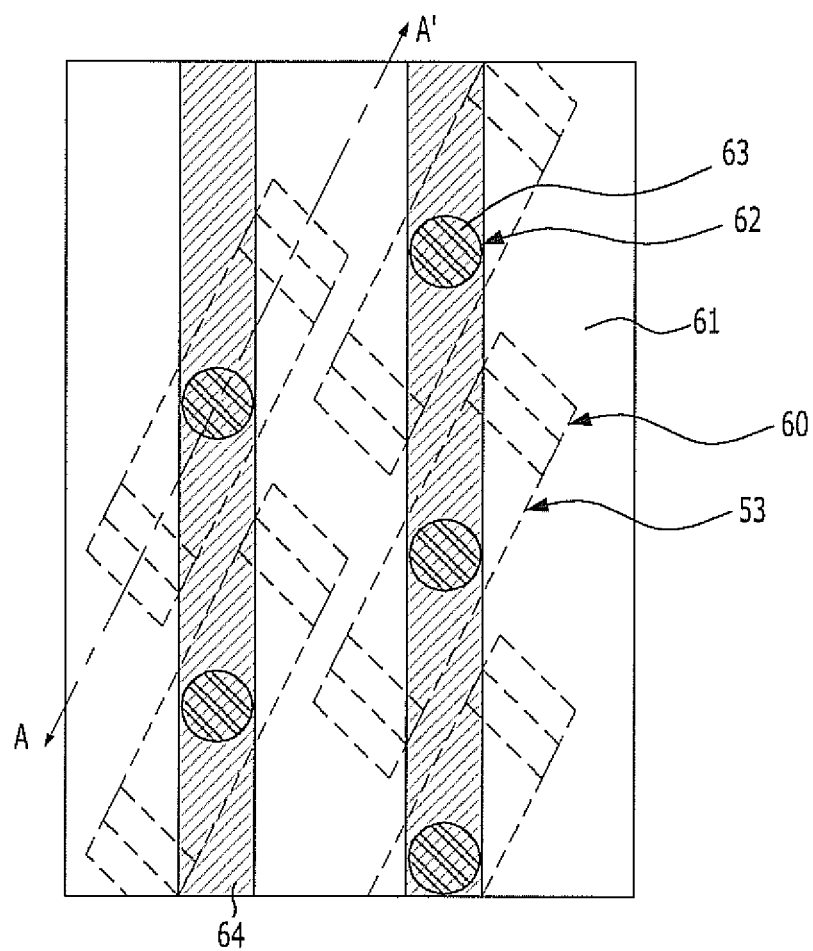
Figure 7D:
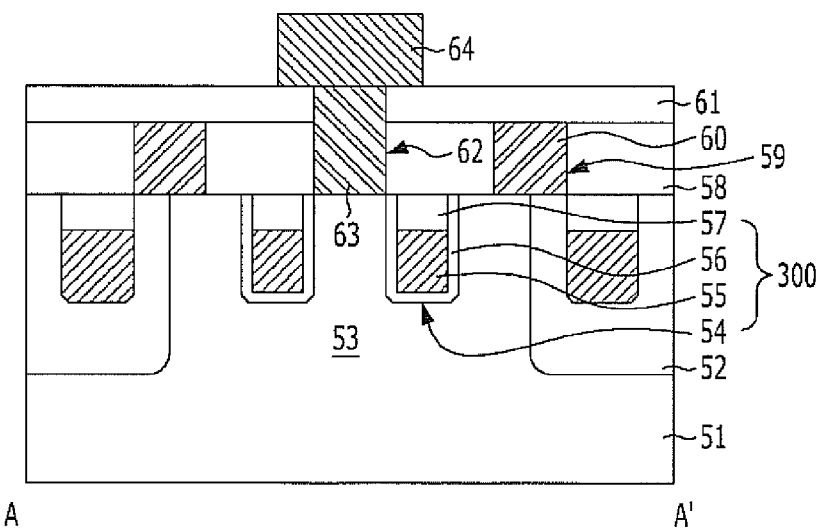

Referring to FIGS. 6D and 7D, a bit line 64 is formed on the second interlayer dielectric layer 61 so as to contact the bit line contact plug 63. At this time, the bit line 64 is formed to cross the buried gate 300.

The semiconductor device in accordance with the second embodiment of the present invention has such a structure that the contact pad 60 is coupled to both ends of the active region 53. Therefore, the bit line 64 may not be shifted, unlike the first embodiment of the present invention. That is, the bit line 64 in accordance with the second embodiment of the present invention is formed to cross the center of the active region 53 in a direction perpendicular to the buried gate 300, as in the conventional semiconductor device.

Figure 6E:
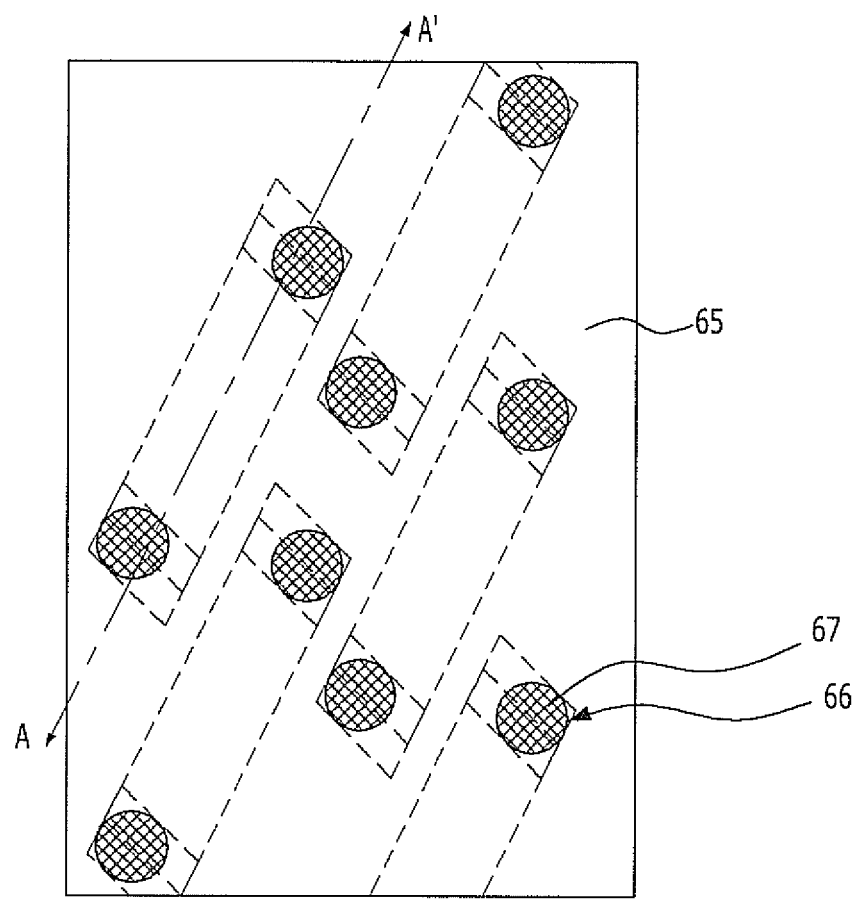
Figure 7E:
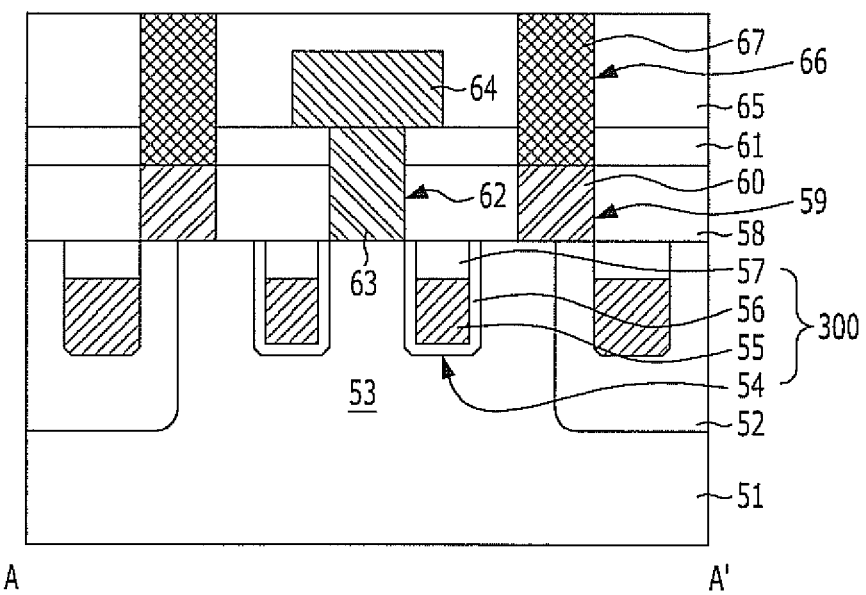

Referring to FIGS. 6E and 7E, a third interlayer dielectric layer 65 is formed on the second interlayer dielectric layer 61 so as to cover the bit line 64. The third interlayer dielectric layer 65 may be formed of the same material as the first and second interlayer dielectric layers 58 and 61, for convenience of a subsequent process.

The first to third interlayer dielectric layers 58, 61, and 65 are selectively etched to form a storage node contact hole 66. At this time, the storage node contact hole 66 is formed to expose the contact pads 60 contacting both edges of the active region 53.

The storage node contact hole 66 is filled with a conductive material to form a storage node contact plug 67. At this time, the storage node contact plug 67 may be formed of the same material as the contact pad 60.

In accordance with the second embodiment of the present invention, the contact pad 60 is formed on the substrate 51 so as to contact both edges of the active region 53. Therefore, a bridge between the adjacent active regions 53 may be substantially prevented and a contact margin of the storage node contact plug 67 may be secured. This will be described in more detail with reference to FIG. 8.

Figure 8:
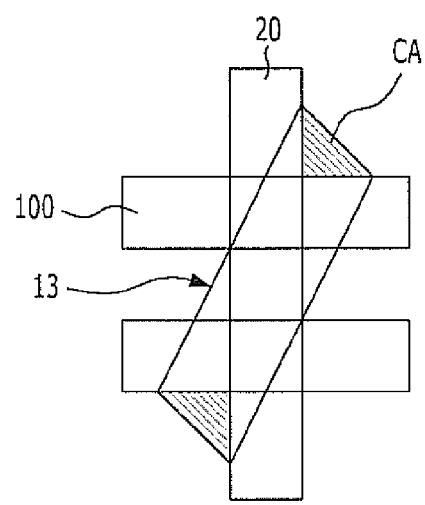
FIG. 8 is a plan view comparatively illustrating the conventional semiconductor device and the semiconductor device in accordance with the second embodiment of the present invention.
Figure 8:
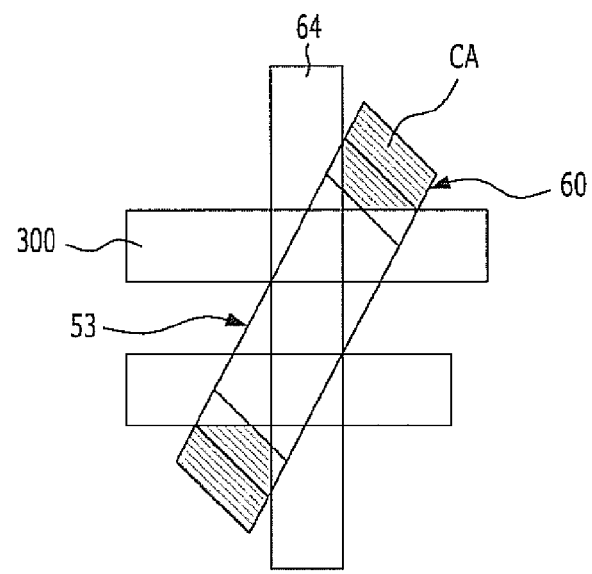

FIG. 8 is a plan view comparatively illustrating the conventional semiconductor device and the semiconductor device in accordance with the second embodiment of the present invention.

Referring to FIG. 8, the conventional semiconductor device has such a structure that the contact area CA of both edges of the active region 13 where a storage node contact plug is to be formed is significantly reduced by the buried gate 100 and the bit line 20.

The semiconductor memory device in accordance with the second embodiment of the present invention may increase the contact area CA of the active region 53 where a storage node contact plug is to be formed by the contact pad 60 coupled to both ends of the active region 53.

In accordance with the embodiment of the present invention, the contact pads are provided to substantially prevent a bridge between adjacent active regions and simultaneously secure a contact margin of the storage node contact plug.

While the present invention has been described with respect to the specific embodiments, it will be apparent to those skilled in the art that various changes and modifications may be made without departing from the spirit and scope of the invention as defined in the following claims.

What is claimed is:

1. A semiconductor device comprising:
   a word line;
   a bit line crossing the word line;
   an active region arranged in an oblique direction with respect to the word line and the bit line;
   a contact pad contacting one end of the active region and extending in the oblique direction; and
   storage node contact plugs coupled to the one end of the active region through the contact pad and directly electrically coupled to the other end of the active region, respectively,
   wherein the bit line crosses the active region and is offset from a center of the active region toward the contact pad.

2. The semiconductor device of claim 1, wherein the contact pad contacts the one end of the active region and extends outwardly from the active region.

3. The semiconductor device of claim 1, wherein the word lines comprise a buried gate.

4. A method for fabricating a semiconductor device, comprising:
- forming an isolation layer and an active region that is isolated by the isolation layer and arranged in a first direction, in a substrate;
- forming a word line that crosses the active region in an oblique direction, in the substrate;
- forming an interlayer dielectric layer over an entire surface of the substrate;
- forming a contact pad that passes through the interlayer dielectric layer and contacts one end of the active region wherein the contact pad extends in the first direction;
- forming a bit line that crosses the word line, after forming the contact pad; and
- forming storage node contact plugs coupled to the one end of the active region through the contact pad and directly coupled to the other end of the active region respectively.

5. The method of claim 4, wherein the forming of the contact pad comprises:
- forming a open region to expose the one end of the active region and the isolation layer in the interlayer dielectric layer; and
- burying a conductive layer in the open region.

6. The method of claim 5, wherein, in the forming of the bit line, the bit line is formed to be offset from a center of the active region toward the contact pad.

7. The method of claim 4, wherein the word line comprises a buried gate.

\* \* \* \* \*